(12) United States Patent
Lim et al.

(10) Patent No.: US 10,607,818 B2
(45) Date of Patent: Mar. 31, 2020

(54) SUPPORT UNIT, APPARATUS AND METHOD FOR TREATING A SUBSTRATE

(71) Applicant: SEMES CO., LTD., Chungcheongnam-do (KR)

(72) Inventors: Doo Ho Lim, Chungcheongnam-do (KR); Chang-Seung Ha, Gyeonggi-do (KR); Seungbae Lee, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 235 days.

(21) Appl. No.: 15/607,320

(22) Filed: May 26, 2017

(65) Prior Publication Data

US 2017/0345625 A1    Nov. 30, 2017

(30) Foreign Application Priority Data

May 27, 2016 (KR) .................. 10-2016-0065559

(51) Int. Cl.
*H01J 37/32* (2006.01)
*H01L 21/683* (2006.01)

(52) U.S. Cl.
CPC ...... *H01J 37/32715* (2013.01); *H01J 37/321* (2013.01); *H01J 37/32091* (2013.01); *H01J 37/32366* (2013.01); *H01L 21/6833* (2013.01)

(58) Field of Classification Search
USPC ............. 118/728, 50, 733, 50.1; 216/67, 37; 156/345.1, 345.51; 361/230, 234
See application file for complete search history.

(56) References Cited

U.S. PATENT DOCUMENTS

| | | | | |
|---|---|---|---|---|
| 2004/0040665 A1* | 3/2004 | Mizuno | ............... | H01L 21/6833 156/345.51 |
| 2006/0066247 A1* | 3/2006 | Koshiishi | .......... | H01J 37/32018 315/111.21 |
| 2013/0126475 A1* | 5/2013 | Dhindsa | ............ | H01J 37/32091 216/61 |

FOREIGN PATENT DOCUMENTS

| | | |
|---|---|---|
| CN | 101872733 A | 10/2010 |
| CN | 101908459 A | 12/2010 |
| JP | 09199578 A | 7/1997 |
| JP | 11233487 A | 8/1999 |
| JP | H11-233487 A | 8/1999 |
| JP | 2010-238730 A | 10/2010 |
| JP | 2010238730 A | 10/2010 |
| KR | 10-2007-0091734 A | 9/2007 |

(Continued)

OTHER PUBLICATIONS

Korean Examination Report dated Jan. 19, 2018, for corresponding Korean Patent Application No. 10-2016-0065559, 5 pages.

*Primary Examiner* — Yewebdar T Tadesse
(74) *Attorney, Agent, or Firm* — Procopio, Cory, Hargreaves & Savitch LLP

(57) ABSTRACT

An embodiment includes a support unit, substrate treating apparatus and substrate treating method. The substrate treating apparatus comprises: a process chamber having a treatment space inside thereof; a support unit for supporting a substrate inside of the process chamber; and a gas supply unit for supplying the treatment gas into the treatment space, wherein the support unit comprises: an electrode layer of a metal material to which a high frequency electric power can be applied; a ground line having one end connected to the electrode layer and the other end grounded; and a switch provided on the ground line.

12 Claims, 9 Drawing Sheets

(56) References Cited

FOREIGN PATENT DOCUMENTS

| KR | 10-0845896 B1 | 7/2008 |
|----|---------------|--------|
| KR | 10-0883231 B1 | 2/2009 |
| KR | 10-1125430 B1 | 3/2012 |
| KR | 1020120124831 A | 11/2012 |
| KR | 1020150055549 A | 5/2015 |

* cited by examiner

SUPPORT UNIT, APPARATUS AND METHOD FOR TREATING A SUBSTRATE

CROSS-REFERENCE TO RELATED APPLICATIONS

A claim for priority under 35 U.S.C. § 119 is made to Korean Patent Application No. 10-2016-0065559 filed on May 27, 2016 in the Korean Intellectual Property Office, the entire contents of which are hereby incorporated by reference.

BACKGROUND

This disclosure relates to a support unit, an apparatus and a method for treating a substrate.

Plasma is generated by very high temperature, strong electric fields, or RF electromagnetic fields, and refers to a state of ionized gas composed of ions, electrons, radicals, and the like. The semiconductor device manufacturing process performs an etching process using plasma. The etching process performed by colliding the ion particles contained in the plasma with the substrate. The etching process is performed inside the process chamber. A process gas is supplied into the process chamber, and high-frequency power is applied to the process chamber to excite the process gas into a plasma state.

FIG. 1 shows a general support unit in a substrate treating apparatus. A first dielectric plate 1 for supporting a substrate W, an electrode layer 2 of a conductive material in a bottom part, and a second dielectric plate 3 are sequentially provided. The first dielectric plate 1 may be provided with a lift pin (not shown) for supporting the substrate. A cooling path 4 where a cooling fluid flows is formed in the second dielectric plate 3. When the cooling fluid flows, electrostatic force is generated by the friction between the cooling fluid and the outer wall of the cooling path. Charges on the outer wall of the cooling path 4 cause electromagnetic induction phenomena to occur on the electric charges existing in the electrode layer and the plates 1, 2, 3. For example, referring to FIG. 1, Positive charges are distributed in the upper portion of the second dielectric plate 3 due to negative charges generated in the outer wall of the cooling path. Also, a negative charge is distributed in the lower part of the electrode layer 2, and a positive charge is distributed in the upper part of the electrode layer 2. Also, due to the electromagnetic induction phenomenon, negative charges are distributed in the lower portion of the first dielectric plate 1, and positive charges are distributed in the upper portion of the first dielectric plate 1. A negative charge is distributed to a lower portion of the substrate made of a silicon material, and as a result, the substrate is chucked to the first dielectric plate 1.

On the other hand, when the process is finished and the substrate is to be unloaded from the first dielectric plate 1, the substrate w must not be chucked to the first dielectric plate 1. However, as described above, there is a problem that the substrate is chucked by an unintended chucking force by electromagnetic induction, and the substrate is damaged in the process of unloading the substrate.

SUMMARY

Embodiments of the inventive concept described herein relate to provide a support unit, a substrate treating apparatus and method therein which may prevent unintentional chucking of a substrate when the substrate is unloaded, thereby preventing the substrate from being damaged.

The objects of the inventive concept are not limited to the above descriptions. Other objects thereof will be understandable by those skilled in the art from the following descriptions.

Example embodiments of the inventive concept provide a substrate treating apparatus.

In example embodiments, the substrate treating apparatus comprises: a process chamber having a treatment space inside thereof; a support unit for supporting a substrate inside of the process chamber; and a gas supply unit for supplying the treatment gas into the treatment space, wherein the support unit comprises: an electrode layer of a metal material to which a high frequency electric power can be applied; a ground line having one end connected to the electrode layer and the other end grounded; and a switch provided on the ground line.

In example embodiments, the ground line comprises a first line connected to the electrode layer, and a second line which is grounded, wherein the switch is provided to electrically connect the second line and the first line.

In example embodiments further comprises a controller for controlling the switch, wherein the controller maintains the switch open while high-frequency power is applied to the electrode layer and maintains the switch closed such that the second line and the first line are electrically connected while the high frequency power is not applied to the electrode layer.

In example embodiments, a resistance element having a predetermined resistance value is provided in the second line.

In example embodiments, the second line is provided with a plurality of numbers and each second line is provided in parallel with one another, wherein the switch is provided to electrically connect any one of the second lines with the first line.

In example embodiments, the controller maintains the switch open while high-frequency power is applied to the electrode layer and maintains the switch closed such that any one of the second lines is electrically connected to the first line while the high frequency power is not applied to the electrode layer.

In example embodiments, in each of the second lines, a resistance element having a predetermined resistance value is provided, and the resistance values of the resistance elements are different from each other.

Example embodiments of the inventive concept provide a support unit.

In example embodiments, the support unit comprises: an electrode layer of a metal material to which a high frequency electric power can be applied; a ground line having one end connected to the electrode layer and the other end grounded; and a switch provided on the ground line.

In example embodiments, the ground line comprises a first line connected to the electrode layer, and a second line which is grounded, wherein the switch is provided to electrically connect the second line and the first line.

In example embodiments further comprises a controller for controlling the switch, wherein the controller maintains the switch open while high-frequency power is applied to the electrode layer and maintains the switch closed such that the second line and the first line are electrically connected while the high frequency power is not applied to the electrode layer.

In example embodiments, a resistance element having a predetermined resistance value is provided in the second line.

In example embodiments, the second line is provided with a plurality of numbers and each second line is provided in parallel with one another, wherein the switch is provided to electrically connect any one of the second lines with the first line.

In example embodiments, the controller maintains the switch open while high-frequency power is applied to the electrode layer and maintains the switch closed such that any one of the second lines is electrically connected to the first line while the high frequency power is not applied to the electrode layer.

In example embodiments, in each of the second lines, a resistance element having a predetermined resistance value is provided, and the resistance values of the resistance elements are different from each other.

Example embodiments of the inventive concept provide a substrate treating method.

In example embodiments, the substrate treating method disconnects the connection between the electrode layer and the ground within the ground line while the high-frequency power is applied to the electrode layer, and maintains a connection between the electrode layer and the ground in the ground line while high frequency power is not applied to the electrode layer.

In example embodiments, a resistance element having a predetermined resistance value is provided on the ground line, wherein the resistance element is positioned in the lower position of a connection point for disconnecting or holding a connection between the electrode layer and the ground.

Embodiments of the inventive concepts may prevent unintentional chucking of the substrate when the substrate is unloaded, thereby preventing the substrate from being damaged.

The objects of the inventive concept are not limited to the above descriptions. Other effects thereof will be understandable by those skilled in the art from the following descriptions and drawings.

DETAILED DESCRIPTION OF THE EMBODIMENTS

Advantages and features of the present inventive concept, and implementation methods thereof will be clarified through following embodiments described with reference to the accompanying drawings. The present inventive concept may, however, be embodied in different forms and should not be construed as limited to the embodiments set forth herein. Rather, these embodiments are provided so that this disclosure will be thorough and complete, and will fully convey the scope of the present invention to those skilled in the art. Further, the present inventive concept is only defined by scopes of claims.

In an embodiment of the present invention, a substrate treating apparatus for etching a substrate by using plasma is described. However, the present invention is not limited to this, and it is applicable to various kinds of apparatuses that perform a process using a support unit provided with a cooling path.

Figure 1:
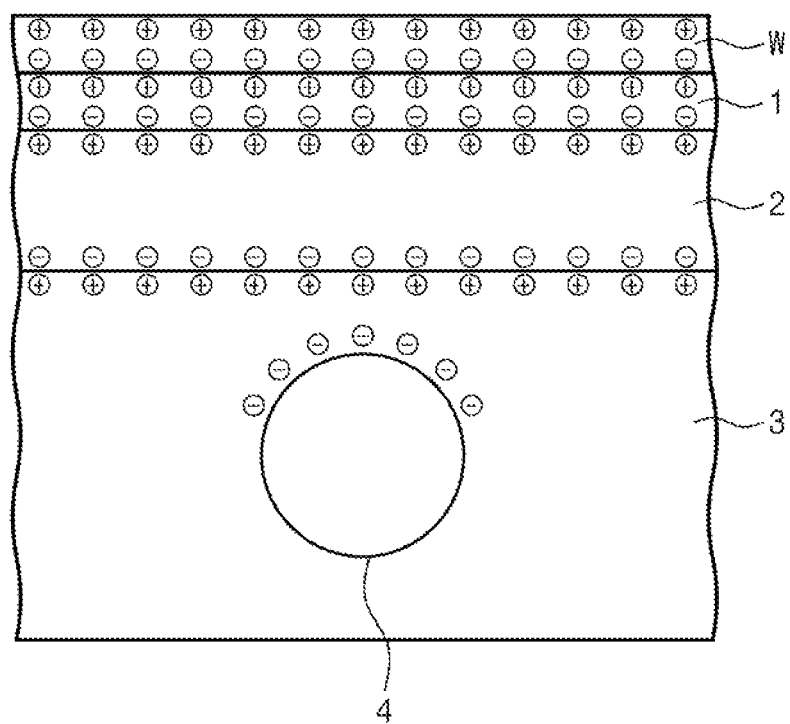
FIG. 1 shows the electromagnetic induction phenomenon in a support unit of the substrate treating apparatus.
Figure 2:
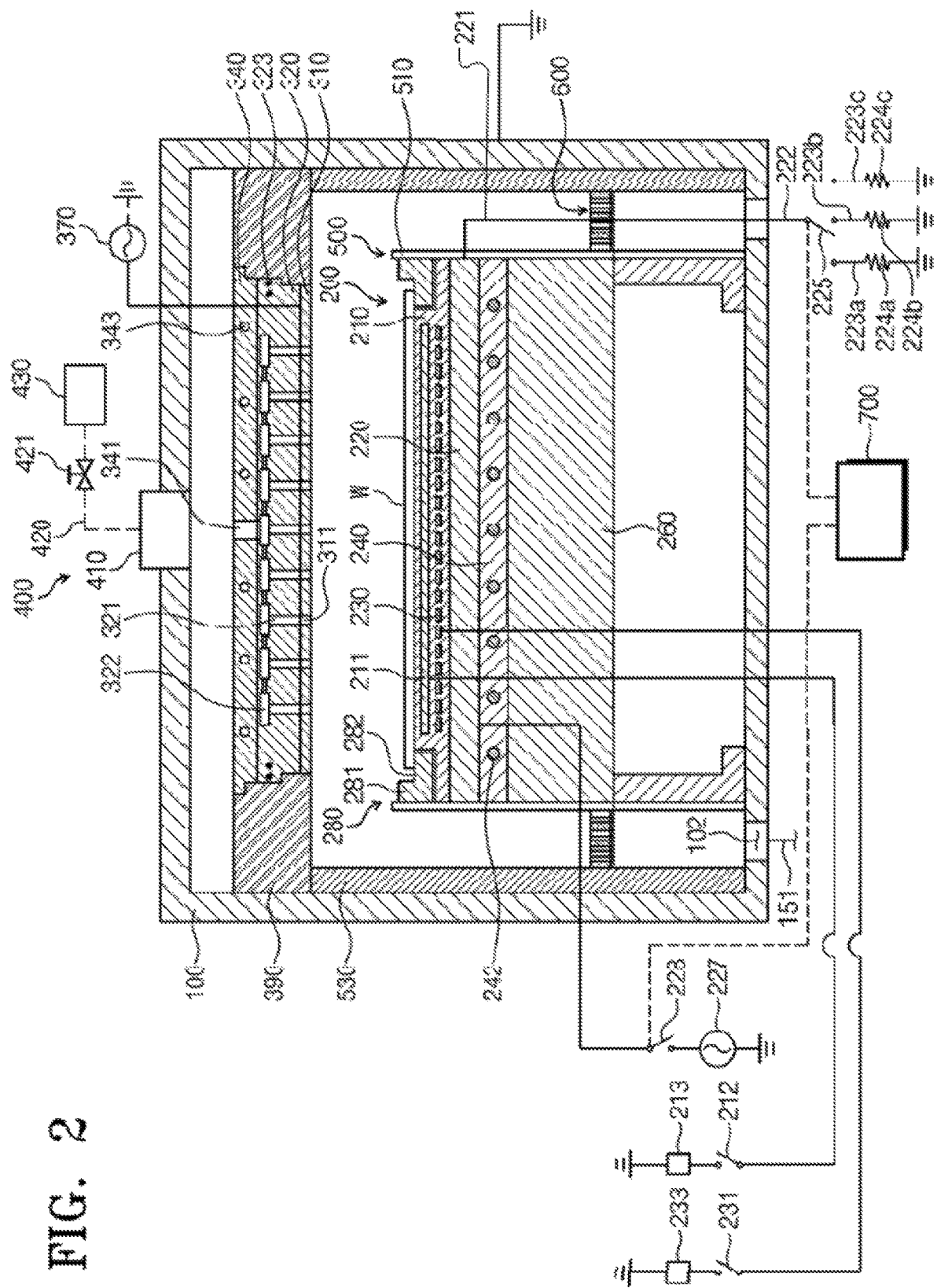
FIG. 2 is a view showing a substrate treating apparatus according to the present invention.

FIG. 2 is a view showing a substrate treating apparatus according to the present invention.

Referring to FIG. 2, a substrate treating apparatus 10 treats the substrate W using plasma. The substrate treating apparatus 10 comprises a process chamber 100, a support unit 200, a shower head unit 300, a gas supply unit 400, a liner unit 500, a baffle unit 600, and a controller 700.

The process chamber 100 provides a treatment space for performing a process for treating a substrate therein. The process chamber 100 has treatment space therein and provided as a sealed form. The process chamber 100 may be provided with a metal material. The process chamber 100 may be provided with an aluminum material. The process chamber 100 may be grounded. An exhaust hole 102 may be formed on a bottom surface of the process chamber 100. The exhaust hole 102 may be connected to an exhaust line 151. The exhaust line 151 is connected to a pump (not shown). A reaction by-product generated in a process step and a gas which exists in an internal space of the process chamber 100 may be discharged through the exhaust line 151. The internal space of the process chamber 100 may be decompressed to a predetermined compression by an exhaust process.

A heater 150 is provided on the wall of the process chamber 100. The heater 150 heats the walls of the process chamber 100. The heater 150 is electrically connected to a heating power (not shown). The heater 150 generates heat by resisting a current applied from a heating power (not shown). The heat generated in the heater 150 is transferred to the inner space. The heat generated in the heater 150 keeps the treatment space at a predetermined temperature. The heater 150 is provided as a coil-shaped hot wire. A plurality of heaters 150 may be provided on the wall of the process chamber 100.

The support unit 200 may be located in the process chamber 100. The support unit 200 may support the substrate W. The support unit 200 may include an electrostatic chuck for holding the substrate W using an electrostatic force. On the other hand, the support unit 200 may support the substrate W in various methods such as a mechanical clamping. The support unit 200 including the electrostatic chuck may be described as follows.

The support unit 200 comprises a support plate 210, an electrode layer 220, a ground line 221, a switch 225, a heater 230, a lower plate 240, a base plate 260, and a ring member 280.

A substrate W is placed on the support plate 210. The support plate 210 is provided in a disc shape. The support plate 210 may be provided as a dielectric substance. The upper surface of the support plate 210 has a smaller radius than the substrate W. When the substrate W is placed on the support plate 210, the edge region of the substrate W is located outside the support plate 210. The support plate 210 receives an external power source and applies an electrostatic force to the substrate W. The support plate 210 is provided with an electrostatic electrode 211. An electrostatic electrode 211 is electrically connected to the electrostatic power 213. The electrostatic power 213 includes a DC power. A switch 212 is provided between the electrostatic electrode 211 and the electrostatic power 213. The electrostatic electrode 211 can be electrically connected to the electrostatic power 213 by turning on/off the switch 212. When the switch 212 is turned on, a direct current is applied to the electrostatic electrode 211. An electrostatic force is applied between the electrostatic electrode 211 and the substrate W by the current applied to the electrostatic electrode 211. The substrate W is held on to the support plate 210 by an electrostatic force.

The heater 230 is provided inside the support plate 210. The heater 230 is electrically connected to the heating power 233 through a switch 231. The heater 230 generates heat by resisting the electric current applied from the heating power 233. The generated heat is transferred to the substrate W through the support plate 210. The substrate W is held at a predetermined temperature by the heat generated in the heater 230. The heater 230 is provided as a coil-shaped hot wire. A plurality of heaters 230 are provided in the region of the support plate 210.

The electrode layer 220 is provided under the support plate 210. The upper surface of the electrode layer 220 contacts the lower surface of the support plate 210. The electrode layer 220 is provided in a disc shape. The electrode layer 220 is made of a conductive material. The electrode layer 220 may be provided as a metal material. For example, the electrode layer 220 may be provided as an aluminum material. The upper central region of the electrode layer 220 has an area corresponding to the bottom of the support plate 210.

The electrode layer 220 may include a metal plate. According to one example, the electrode layer 220 may be entirely provided as a metal plate. The electrode layer 220 may be electrically connected to the lower power 227 through the switch 228. The lower power 227 may be provided as a high frequency power source for generating high frequency power. The high frequency power may be provided by an RF power. The RF power supply may be provided by a high bias power RF power. The electrode layer 220 receives high-frequency power from the lower power 227. This allows the electrode layer 220 to function as an electrode.

The ground line 221 discharges charge from the electrode layer 220. One end of the ground line 221 is connected to the electrode layer 220. The other end of the ground line 221 is grounded. The ground line 221 includes a first line 222 and a second line 223. The first line 222 is connected to the electrode layer 220. The first line 222 is positioned in the upper position of the ground line 221. And the second line 223 is grounded. The second line 223 is positioned in the lower position of the ground line 221. A plurality of second lines 223 may be provided. The second lines 223a, 223b, and 223c are arranged in parallel with each other.

The second line 223 is provided with a resistance element 224 having a predetermined resistance value. The resistance element 224 prevents the arcing phenomenon that occurs when the high frequency power applied to the electrode layer 220 passes through the ground line 221. Resistance elements 224a, 224b, and 224c having different resistance values may be provided in each of the second lines 223a, 223b, and 223c.

The switch 225 is provided to disconnect or maintain the connection between the electrode layer 220 and ground. The switch 225 is provided to electrically connect the first line 222 and the second line 223. The switch 225 is provided to electrically connect the first line 222 to any one of the second lines 223.

A lower plate 240 is provided below the electrode layer 220. The lower plate 240 may be provided as a circular plate form. The lower plate 240 may be provided with an area corresponding to the electrode layer 220. A cooling path 242 is provided in the lower plate 240. The cooling fluid is supplied to the cooling path 242. The lower plate 240 may be provided as an insulator. As an example, the lower plate 240 may be provided with a dielectric.

The base plate 260 is located below the lower plate 240. The base plate 260 may be provided as an aluminum material. The base plate 260 is provided in a circular shape when viewed from above. A lift pin module (not shown) for moving the substrate W to be transferred from an external transfer member to the support plate 210 may be positioned in the inner space of the base plate 260.

The ring member 280 is arranged in the edge region of the support unit 200. The ring member 280 has a ring shape. The ring member 280 is provided so as to surround the upper portion of the support plate 210. For example, the ring member 280 may be provided as a focus ring. The ring member 280 includes an inner lateral part 282 and an outer lateral part 281. The inner lateral part 282 is located inside the ring member 280. The inner lateral part 282 is provided lower than the outer lateral part 281. The upper surface of the inner lateral part 282 is provided at the same height as the upper surface of the support plate 210. The inner lateral part 282 supports the edge region of the substrate W positioned outside the support plate 210. The outer lateral part 281 is located outside the inner lateral part 282.

The shower head unit 300 is located at the top of the support unit 200 inside the process chamber 100. The shower head unit 300 is positioned opposite from the support unit 200. The shower head unit 300 includes a shower head 310, a gas injection plate 320, a heater 323, a cooling plate 340, and an insulation plate 390.

The shower head 310 is spaced apart from the upper surface of the process chamber 100 by a predetermined distance. The shower head 310 is located at the top of the support unit 200. A constant space is formed between the shower head 310 and the upper surface of the process chamber 100. The shower head 310 may be provided in a plate shape having a constant thickness. The bottom surface of the showerhead 310 may be polarized on its surface to prevent arcing by plasma. The cross section of the shower head 310 may be provided so as to have the same shape and cross-sectional area as that of the support unit 200. The shower head 310 includes a plurality of injection holes 311. The injection hole 311 penetrates the upper surface and the lower surface of the shower head 310 in the vertical direction.

The gas injection plate 320 is located at the top of the shower head 310. The gas injection plate 320 is certain spaced apart from the upper surface of the process chamber 100. The gas injection plate 320 may be provided in a plate shape having a constant thickness.

The heater 323 is provided in the edge region A2 of the gas injection plate 320. The heater 323 heats the gas injection plate 320.

The gas injection plate 320 is provided with a diffusion region 322 and an injection hole 321. The diffusion region 322 and the injection hole 321 are located in the central region of the gas injection plate. The diffusion region 322 spreads the gas supplied from the upper part evenly into the injection hole 321. The diffusion region 322 is connected to the injection hole 321 at the bottom. Adjacent diffusion regions 322 are connected to each other. The injection hole 321 is connected to the diffusion region 322 and penetrates the lower surface in the vertical direction. The injection hole 321 is located opposite to the injection hole 311 of the shower head 310. The gas injection plate 320 may be provided as a metal material.

The cooling plate 340 is located at the top of the gas injection plate 320. The cooling plate 340 may be provided in a plate shape having a constant thickness. The cooling plate 340 has a supply hole 341 formed at the center thereof. The supply hole 341 passes through the gas. The gas that has passed through the supply hole 341 is supplied to the diffusion region 322 of the gas injection plate 320. A cooling path 343 is formed inside the cooling plate 340. The cooling fluid may be supplied to the cooling path 343. For example, the cooling fluid may be cooling water.

The cooling plate 340 may be provided as a metal material. The cooling plate 340 may be provided with a power. The cooling plate 340 may be electrically connected to a top power 370. The upper power 370 may be provided as a high frequency power source. Alternatively, the cooling plate 340 may be electrically grounded. The cooling plate 340 may be electrically connected to the top power 370. Alternatively, the cooling plate 340 may be grounded to function as an electrode.

The insulation plate 390 supports the side of the shower head 310, the gas injection plate 320, and the cooling plate 330. The insulation plate 390 is connected to the side wall of the process chamber 100. The insulation plate 390 is provided so as to surround the shower head 310, the gas injection plate 320, and the cooling plate 340. The insulation plate 390 may be provided in a ring shape. The insulation plate 390 may be provided as a non-metallic material.

The gas supply unit 400 supplies a process gas into the process chamber 100. The gas supply unit 400 comprises a gas supply nozzle 410, a gas supply line 420, and a gas storage unit 430. The gas supply nozzle 410 may be installed in a center area of the process chamber 100. An injection nozzle may be formed on a bottom surface of the gas supply nozzle 410. The injection nozzle may provide a process gas into the process chamber 100. The gas supply line 420 may connect the gas supply nozzle 410 and the gas storage unit 430. The gas supply line 420 may provide a process gas stored in the gas storage unit 430 to the gas supply nozzle 410. A valve 421 may be installed on the gas supply line 420. The valve 421 may turn on or off the gas supply line 420 and adjust the amount of process gas supplied via the gas supply line 420.

The plasma source excites the process gas into the plasma state within the process chamber 100. For example, a capacitively coupled plasma (CCP) may be used as the plasma source. The CCP may include an upper electrode and a lower electrode inside the process chamber 100. According to an example, the upper electrode may be provided to the shower head unit 300, and the lower electrode may be provided to the electrode layer 220. The upper electrode may be provided as a cooling plate 340. High-frequency power may be applied to the lower electrode, and the upper electrode may be grounded. Alternatively, high-frequency power may be applied to both the upper electrode and the lower electrode. As a result, an electromagnetic field is generated between the upper electrode and the lower electrode. The generated electromagnetic field excites the process gas provided inside the process chamber 100 into a plasma state.

The liner unit 500 prevents the inner walls of the process chamber 100 and the support unit 200 from being damaged during the process. The liner unit 500 prevents the impurities generated during the process from being deposited on the inner wall and the support unit 200. The liner unit 500 includes an inner liner 510 and an outer liner 530.

The outer liner 530 is provided on the inner wall of the process chamber 100. The outer liner 530 has a space in which the upper surface and the lower surface are opened. The outer liner 530 may be provided in a cylindrical shape. The outer liner 530 may have a radius corresponding to the inner surface of the process chamber 100. The outer liner 530 is provided along the inner surface of the process chamber 100.

The outer liner 530 may be provided as aluminum. The outer liner 530 protects the inner surface of the body 110. An arc discharge may be generated in the process chamber 100 during the excitation of the process gas. The arc discharge damages the process chamber 100. The outer liner 530 protects the inner surface of the body 110 to prevent the inner surface of the body 110 from being damaged by the arc discharge.

The inner liner 510 is provided surrounding the support unit 200. The inner liner 510 is provided in a ring shape. The inner liner 510 is provided to enclose all of the support plate 210, the electrode layer 220, and the lower plate 240. The inner liner 510 may be provided as aluminum. The inner liner 510 protects the outer surface of the support unit 200.

The baffle unit 600 is positioned between the inner wall of the process chamber 100 and the support unit 200. The baffle is provided in an annular ring shape. A plurality of penetration holes are formed in the baffle. The process gas provided in the process chamber 100 is exhausted to the exhaust hole 102 through the penetration holes of the baffle. The flow of the process gas may be controlled according to the shape of the baffle and the shape of the penetration holes.

Figure 3:
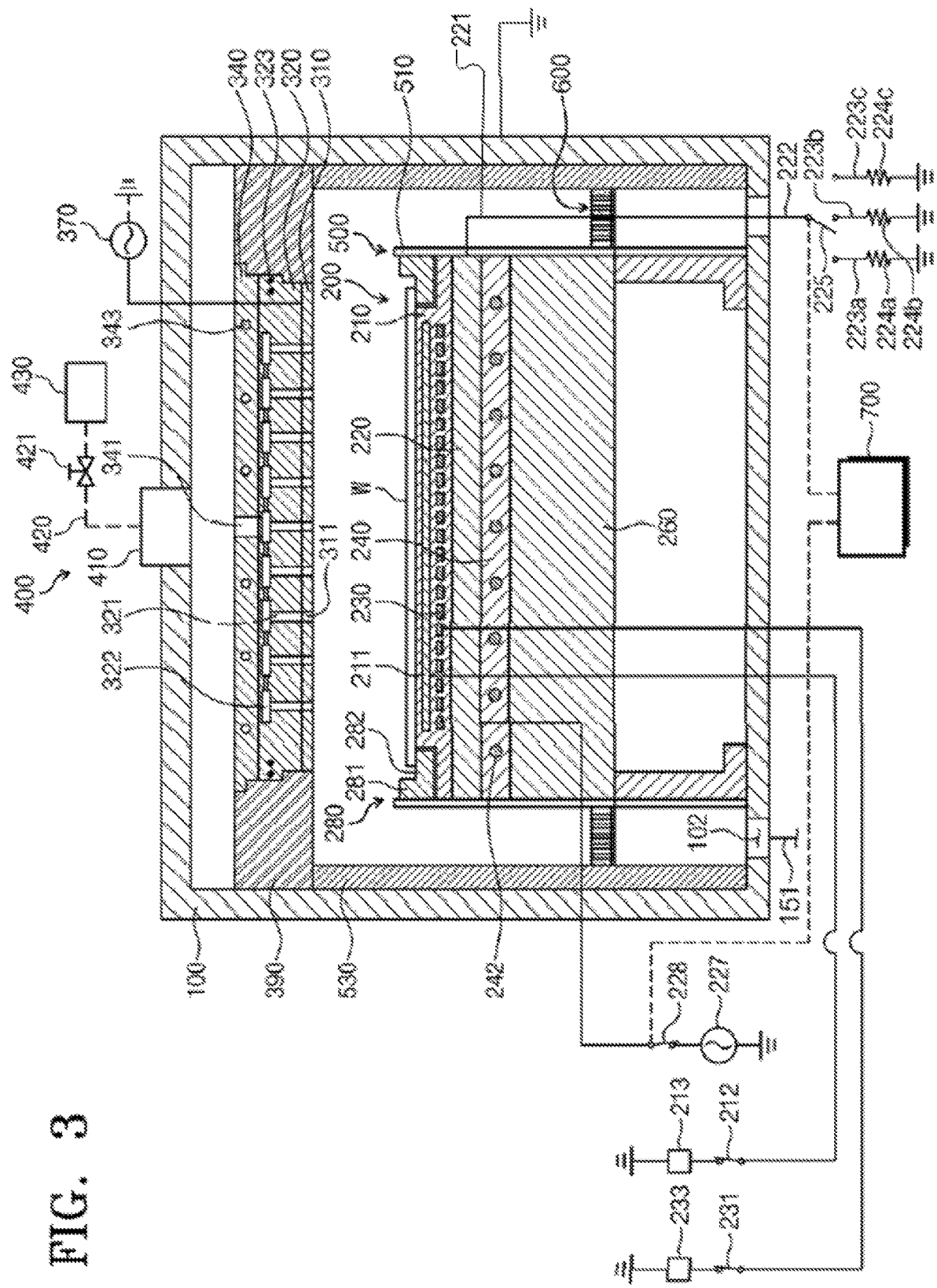
FIG. 3 is a view showing the progress of a substrate treating process in the substrate treating apparatus of FIG. 2.
Figure 4:
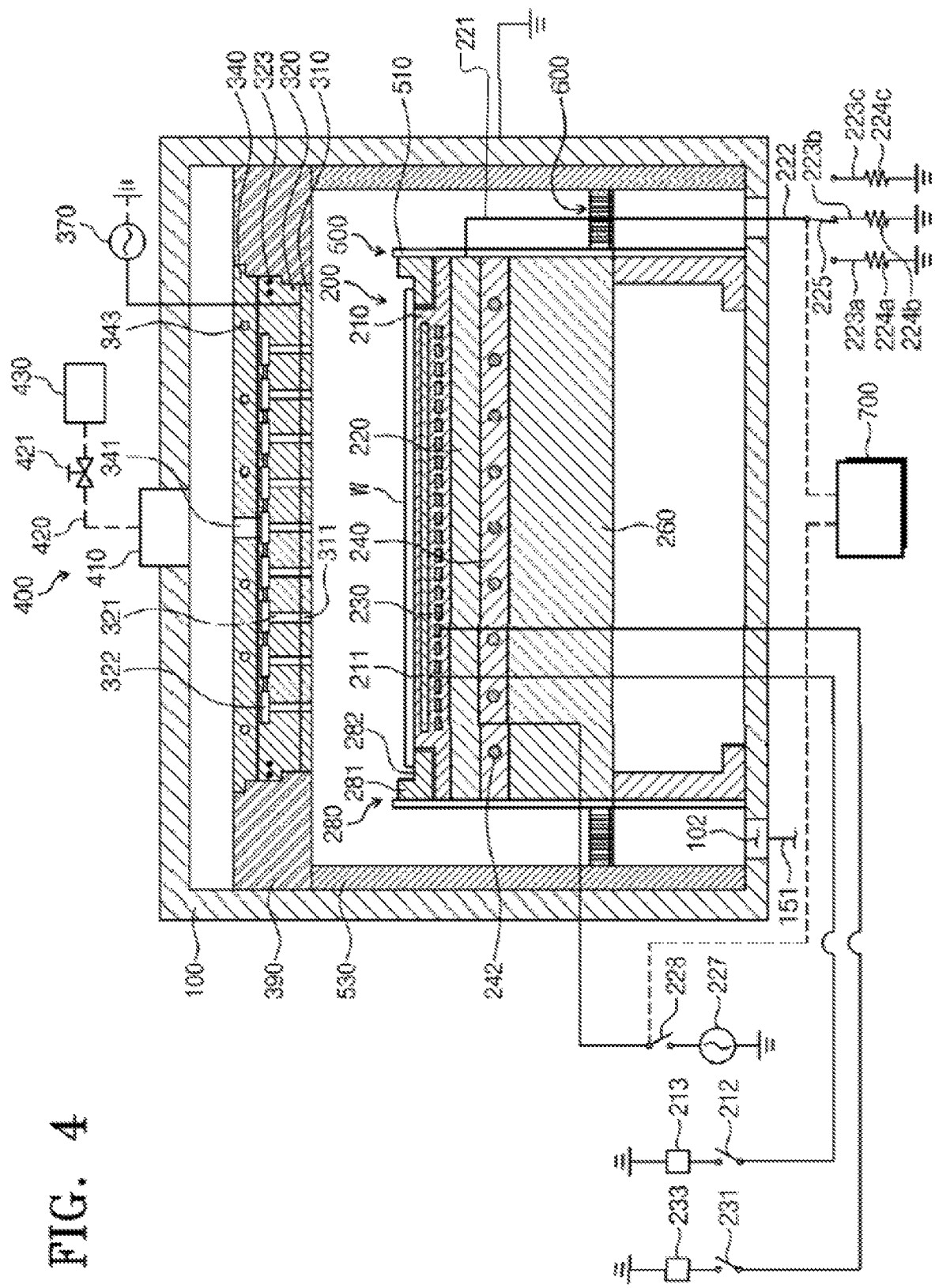
FIG. 4 is a view showing the end of the substrate treating process in the substrate treating apparatus of FIG. 2.
Figure 5:
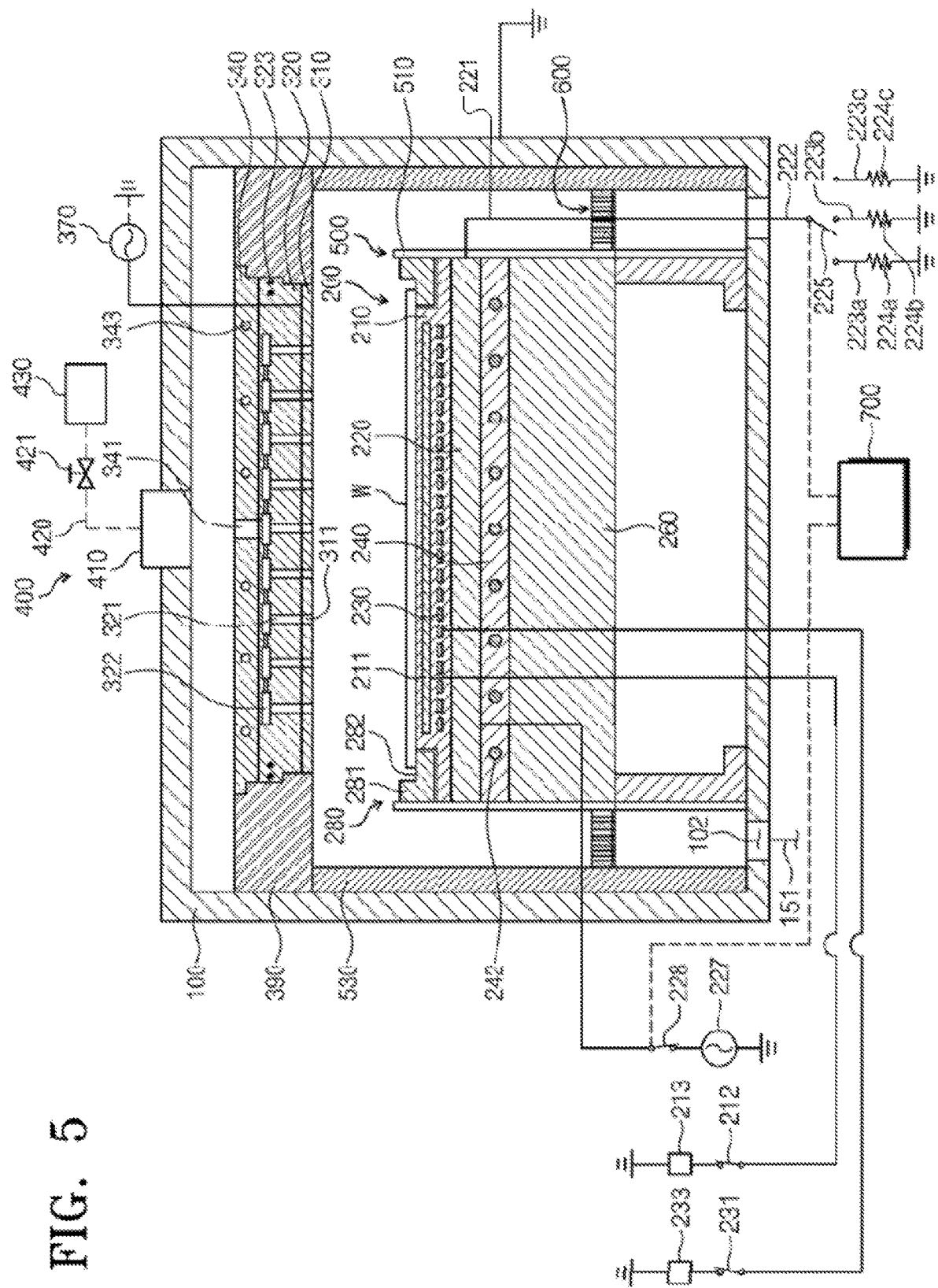
FIGS. 5 to 7 are views sequentially illustrating a method of treating a substrate according to the present invention.

FIG. 3 shows a substrate treating apparatus when a substrate treating process is performed using plasma. FIG. 4 shows a substrate treating apparatus at the end of the substrate treating process.

The controller 700 controls the switches 225 and 228. Referring to FIG. 3, during the process, the switch 228 is closed and high-frequency power is applied to the electrode layer 220 in order to generate plasma. The controller 700 allows the switch 225 to open while high frequency power is applied to the electrode layer 220. That is, the electrical connection between the first line 222 and the second line 223 is disconnected. For example, when the switch 228 is closed, high-frequency power is applied to the electrode layer 220 while the switch 225 is kept open.

Referring to FIG. 4, when the process is completed, there is no need to generate plasma, so that the switch 228 is opened and high frequency power is not applied to the electrode layer 220. The controller 700 keeps the switch 225 in the closed state while the high-frequency power is not applied to the electrode layer 220. That is, the selected one of the second lines 223a, 223b, and 223c and the first line 222 are electrically connected. For example, when the switch 228 is opened, high-frequency power is not applied to the electrode layer 220, during which the switch 225 is closed.

Hereinafter, a method of treating a substrate using the above-described substrate processing apparatus will be described with reference to FIGS. 5 to 8.

An electrostatic force is generated by the friction with the outer wall when the cooling fluid passes the cooling path 242. Like FIG. 5, When high frequency power is applied to the electrode layer 220 and the substrate treating process proceeds, the switch 225 is opened to cut off the electrical connection between the first line 222 and the second line 223. In this case, when the switch 225 is closed, the high-frequency power passes through the ground line 221 and the resistance element 224 provided on the second line 223 may be damaged.

Figure 6:
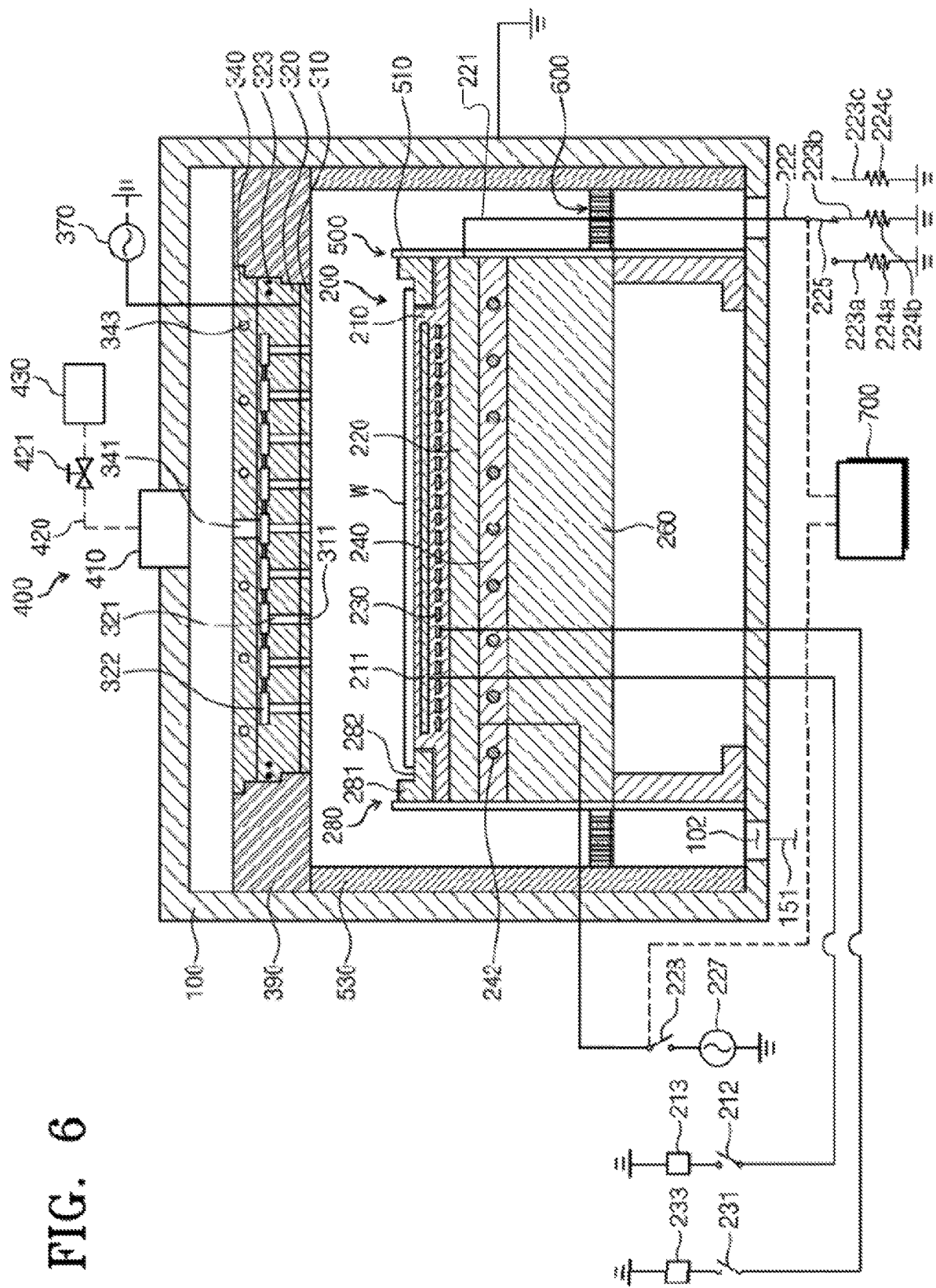

Referring to FIG. 6, when the substrate treating process is completed, that is, when the when the high frequency power is not applied to the electrode layer 220, the switch 225 is closed so that the first line 222 and the second line 223 are electrically connected to each other. Thus, charges inside the electrode layer 220 are discharged through the ground line 221.

Figure 7:
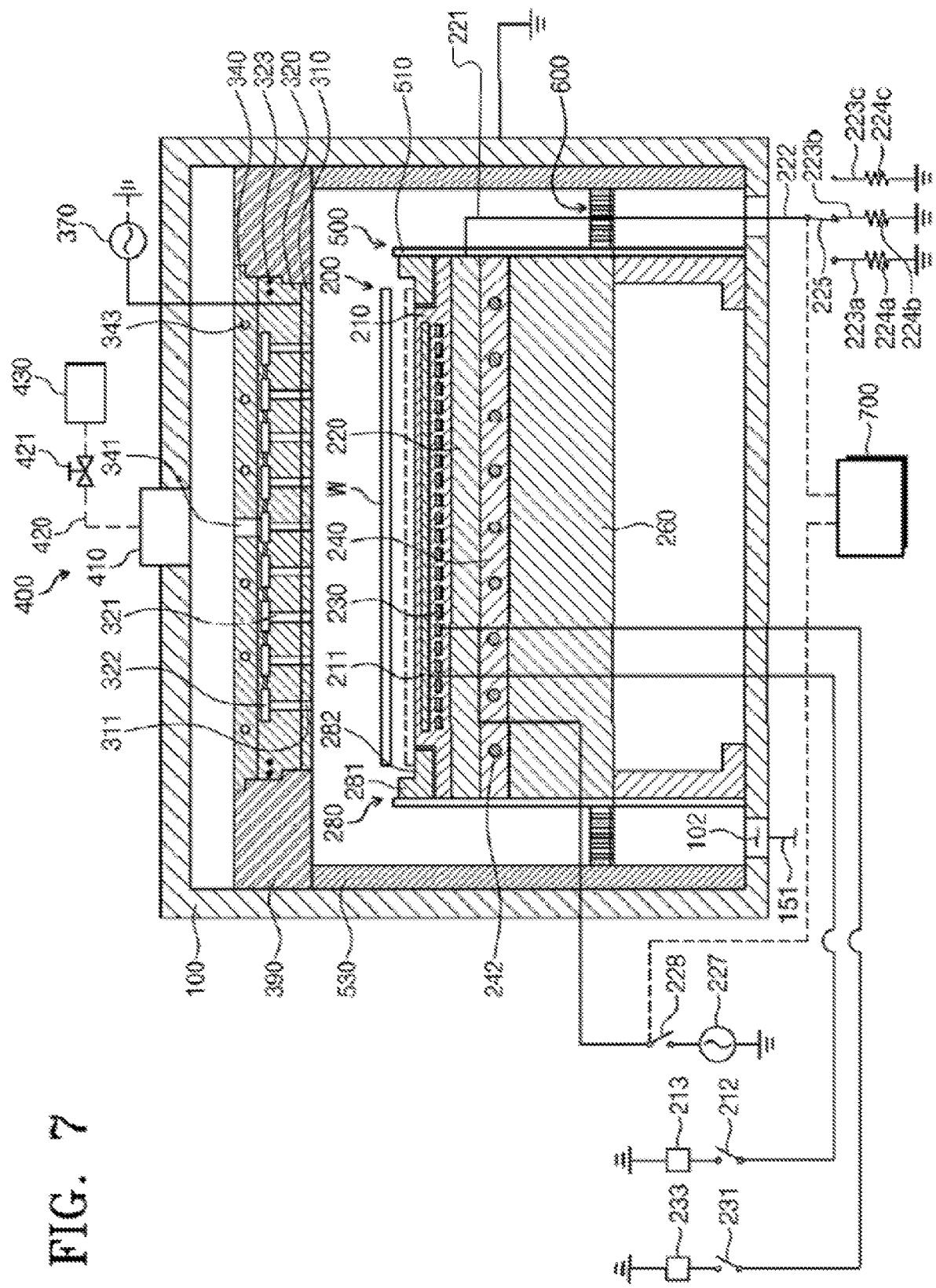

Thereafter, the substrate can be unloaded from the support unit without damaging the substrate as shown in FIG. 7.

On the other hand, the resistance value of the resistance element 224 provided in each second line 223 has relationship with the strength of the applied high frequency power and the arcing phenomenon, the loss of the applied high frequency power and the error of the process accordingly. Generally, the larger the resistance value, the larger the error in the process. Therefore, in consideration of such circumstances, the switch 225 can electrically connect the first line 222 with any one second line 223 provided with the resistance element 224 having an appropriate resistance value according to the process environment.

Figure 8:
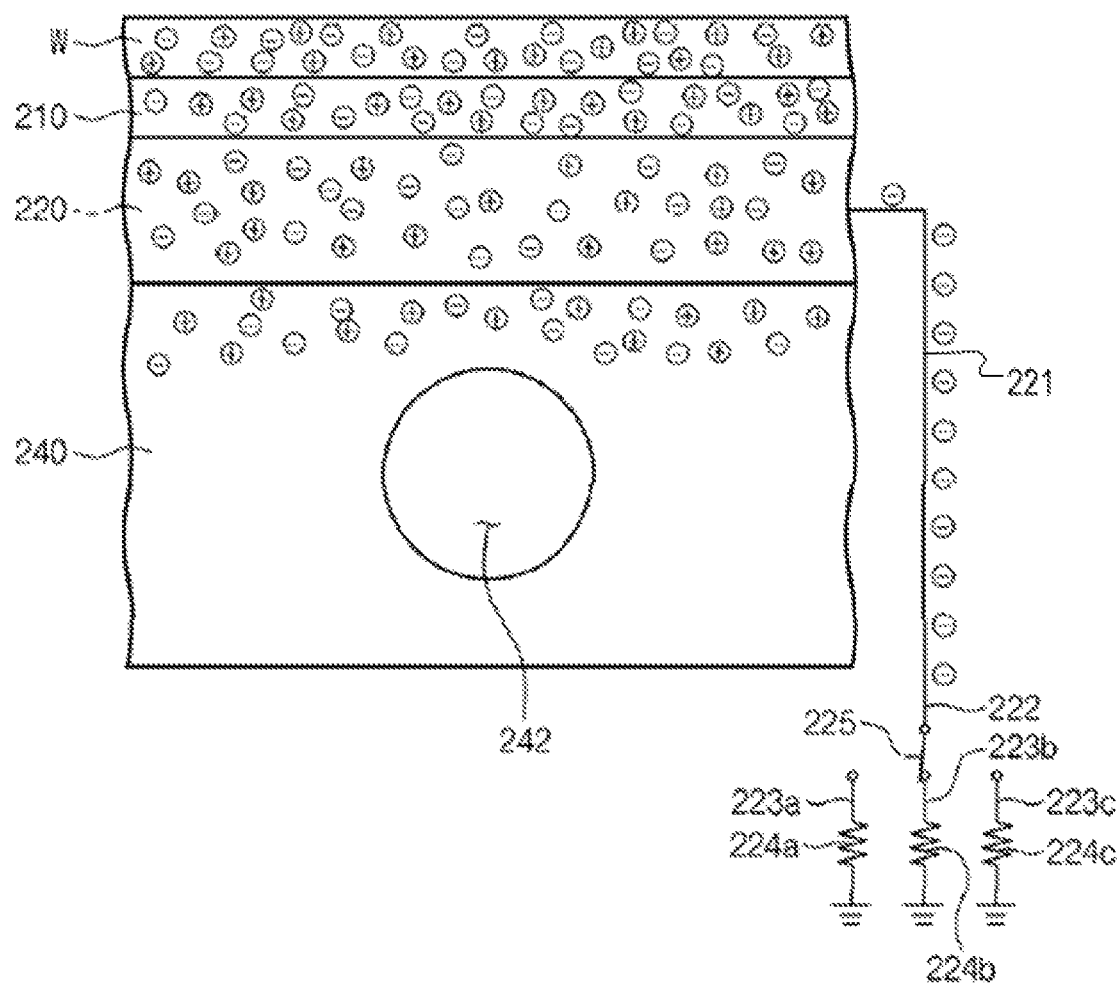
FIG. 8 is a view showing movement and state of charges in the support unit of the substrate treating apparatus of FIG. 2.

FIG. 8 is a view schematically showing the movement of charges when the switch 225 is closed as shown in FIG. 6. For example, the negative charge existing in the electrode layer 220 is discharged to the outside, so that the electromagnetic induction phenomenon does not occur on the charges existing on the substrate w, the support plate 210, and the like. Therefore, it is possible to prevent a chucking phenomenon of an unintended substrate by the electrostatic force. Therefore, it is possible to prevent the substrate from being damaged by the chucking phenomenon upon unloading the substrate after the end of the process.

Figure 9:
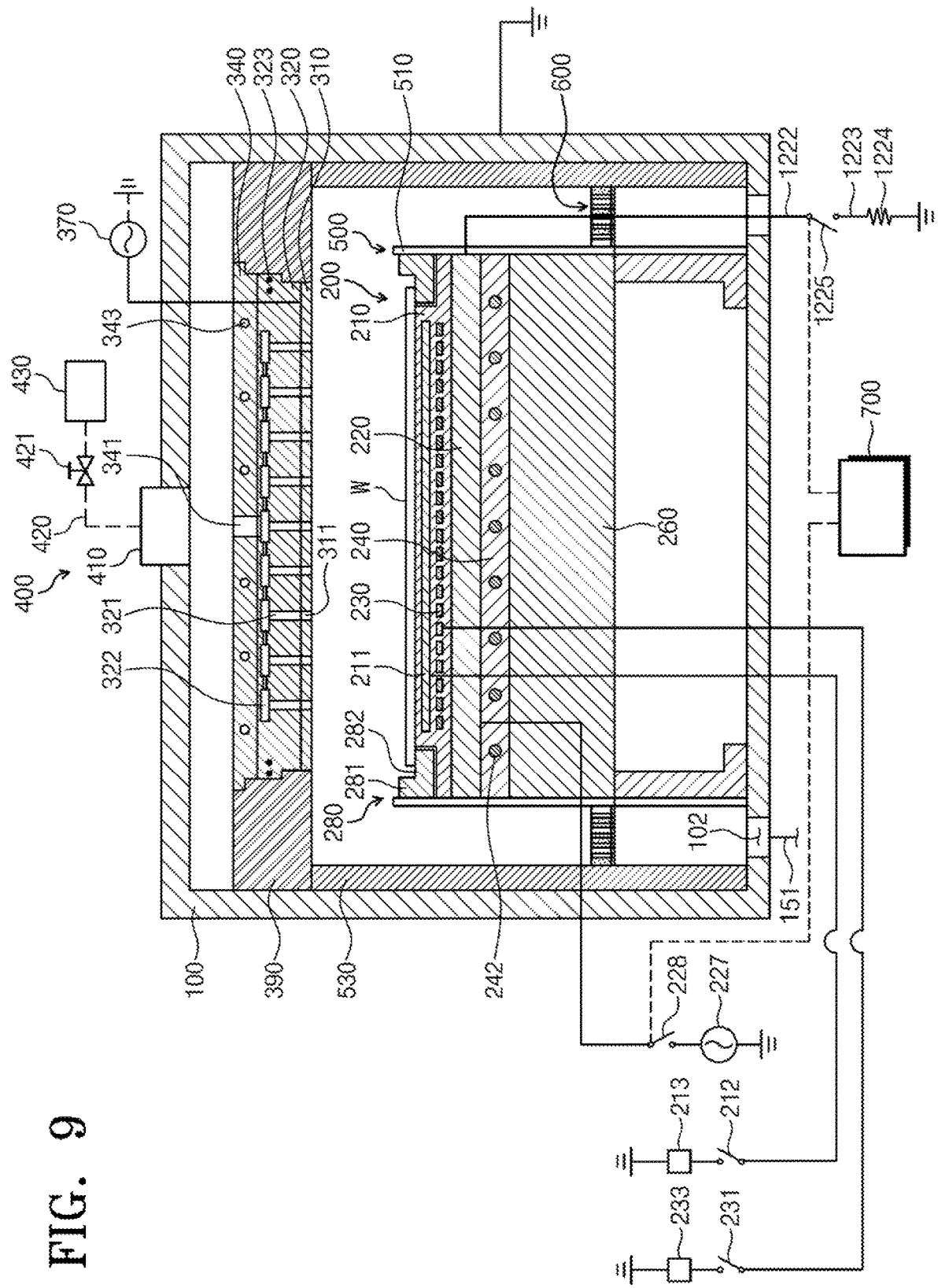
FIG. 9 is a view showing a modification of the substrate treating apparatus of FIG. 2.

In the above-described embodiment, a plurality of second lines is provided. However, as shown in FIG. 9, one second line 1223 may be provided, and one resistance element 1224 may be provided.

In the above-described embodiment, one switch for connecting the first line and the second line is provided and selectively connected to any one of the second lines. However, a separate switch may be provided for each second line to connect or disconnect the ground.

In the above-described embodiments, capacitively coupled plasma (CCP) is used as a plasma source, but an inductively coupled plasma (ICP) source is also possible.

The foregoing detailed descriptions may be merely examples of the embodiments. Further, the above contents merely illustrate and describe preferred embodiments and other embodiments may include various combinations, changes, and environments. That is, it will be appreciated by those skilled in the art that substitutions, modifications and changes may be made in these embodiments without departing from the principles and spirit, the scope of which is defined in the appended claims and their equivalents. Further, it is not intended that the scope of this application be limited to these specific embodiments or to their specific features or benefits. Rather, it is intended that the scope of this application be limited solely to the claims which now follow and to their equivalents.

What is claimed is:

1. A substrate treating apparatus comprising:
a process chamber having a treatment space inside thereof;
a support unit for supporting a substrate inside of the process chamber; and
a gas supply unit for supplying the treatment gas into the treatment space,
wherein the support unit comprises:
an electrode layer of a metal material to which a high frequency electric power can be applied;
a ground line having one end connected to the electrode layer and the other end grounded;
a switch provided on the ground line; and
a controller for controlling the switch,
wherein the ground line comprises:
a first line connected to the electrode layer; and
a second line which is grounded,
wherein the switch is provided to electrically connect the second line and the first line,
wherein the second line is provided with a plurality of numbers and each second line is provided in parallel with one another, wherein the switch is provided to electrically connect any one of the second lines with the first line.

2. The apparatus of claim 1, wherein the controller maintains the switch open while high-frequency power is applied to the electrode layer and maintains the switch closed such that the second line and the first line are electrically connected while the high frequency power is not applied to the electrode layer.

3. The apparatus of claim 1, wherein a resistance element having a predetermined resistance value is provided in the second line.

4. The apparatus of claim 1, wherein the controller maintains the switch open while high-frequency power is applied to the electrode layer and maintains the switch closed such that any one of the second lines is electrically connected to the first line while the high frequency power is not applied to the electrode layer.

5. The apparatus of claim 1, wherein in each of the second lines, a resistance element having a predetermined resistance value is provided, and the resistance values of the resistance elements are different from each other.

6. A support unit comprising:
an electrode layer of a metal material to which a high frequency electric power can be applied;
a ground line having one end connected to the electrode layer and the other end grounded;
a switch provided on the ground line; and
a controller for controlling the switch,
wherein the ground line comprises:
a first line connected to the electrode layer; and
a second line which is grounded,
wherein the switch is provided to electrically connect the second line and the first line,
wherein the second line is provided with a plurality of numbers and each second line is provided in parallel with one another, wherein the switch is provided to electrically connect any one of the second lines with the first line.

7. The support unit of claim 6, wherein the controller maintains the switch open while high-frequency power is applied to the electrode layer and maintains the switch closed such that the second line and the first line are electrically connected while the high frequency power is not applied to the electrode layer.

8. The support unit of claim 6, wherein a resistance element having a predetermined resistance value is provided in the second line.

9. The support unit of claim 6, wherein the controller maintains the switch open while high-frequency power is applied to the electrode layer and maintains the switch closed such that any one of the second lines is electrically connected to the first line while the high frequency power is not applied to the electrode layer.

10. The support unit of claim 6, wherein in each of the second lines, a resistance element having a predetermined resistance value is provided, and the resistance values of the resistance elements are different from each other.

11. A substrate treating method using the apparatus of claim 1 comprising disconnecting the connection between the electrode layer and the ground within the ground line while the high-frequency power is applied to the electrode layer, and maintaining a connection between the electrode layer and the ground in the ground line while high frequency power is not applied to the electrode layer.

12. The method of claim 11, wherein a resistance element having a predetermined resistance value is provided on the ground line, wherein the resistance element is positioned in the lower position of a connection point for disconnecting or holding a connection between the electrode layer and the ground.

* * * * *